(12) United States Patent
Luh et al.

(10) Patent No.: US 9,269,319 B2
(45) Date of Patent: Feb. 23, 2016

(54) DEVICES AND METHODS FOR REDUCING POWER CONSUMPTION AND SIZE OF GATE DRIVERS

(71) Applicant: APPLE INC., Cupertino, CA (US)

(72) Inventors: Louis Luh, Sunnyvale, CA (US); Chun-Yao Huang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/502,856

(22) Filed: Sep. 30, 2014

(65) Prior Publication Data

US 2015/0108916 A1 Apr. 23, 2015

Related U.S. Application Data

(60) Provisional application No. 61/892,262, filed on Oct. 17, 2013.

(51) Int. Cl.
*G09G 3/10* (2006.01)
*G09G 3/36* (2006.01)
*G09G 3/32* (2006.01)

(52) U.S. Cl.
CPC ............ *G09G 3/3677* (2013.01); *G09G 3/3266* (2013.01); *G09G 2310/06* (2013.01)

(58) Field of Classification Search
CPC ... G09G 3/10; G09G 2310/06; G09G 3/3266; G09G 3/3677

USPC ........... 315/169.1–169.3, 223–225, 291, 307; 345/87–100, 304, 211

See application file for complete search history.

(56) References Cited

U.S. PATENT DOCUMENTS

| 2004/0129996 | A1 | 7/2004 | Shin |
| 2008/0238327 | A1* | 10/2008 | Cho .................. G09G 3/3241 315/169.3 |
| 2010/0164597 | A1 | 7/2010 | Steensgaard-Madsen |
| 2013/0027283 | A1 | 1/2013 | Cristaudo et al. |
| 2013/0093743 | A1 | 4/2013 | Takahashi et al. |
| 2013/0136224 | A1 | 5/2013 | Qing et al. |

* cited by examiner

*Primary Examiner* — Jimmy Vu
(74) *Attorney, Agent, or Firm* — Fletcher Yoder PC

(57) ABSTRACT

One gate driver includes an output node configured to be coupled to a gate line and to provide power to the gate line for driving thin-film transistor (TFT) gates of a display. An input node of the gate driver is configured to receive an input signal. The gate driver includes a first field-effect transistor (FET) having a gate, a drain, and a source. The drain may be coupled to the input node and the source may be coupled to the output node. The gate driver also includes a second FET having a gate, a drain, and a source. The drain may be coupled to the input node. The gate driver includes a capacitor having a first end coupled to the gates of the FETs and a second end coupled to the source of the second FET. Using the gate driver power consumption of the display may be reduced.

25 Claims, 13 Drawing Sheets

DEVICES AND METHODS FOR REDUCING POWER CONSUMPTION AND SIZE OF GATE DRIVERS

CROSS REFERENCE TO RELATED APPLICATIONS

This application is a Non-Provisional Application claiming priority to U.S. Provisional Patent Application No. 61/892,262, entitled "Devices And Methods For Reducing Power Consumption And Size Of Gate Drivers", filed Oct. 17, 2013, which is herein incorporated by reference.

BACKGROUND

The present disclosure relates generally to electronic displays and, more particularly, to reducing power consumption and size of gate drivers of a display.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic displays, such as liquid crystal displays (LCDs) or organic light emitting diode (OLED) displays, are commonly used in electronic devices such as televisions, computers, and handheld devices (e.g., cellular telephones, audio and video players, gaming systems, and so forth). Such display devices typically provide a flat display in a relatively thin package that is suitable for use in a variety of electronic goods. In addition, such display devices typically use less power than comparable display technologies, making them suitable for use in battery-powered devices or in other contexts where it is desirable to minimize power usage.

LCDs typically include an LCD panel having, among other things, a liquid crystal layer and various circuitry for controlling orientation of liquid crystals within the layer to modulate an amount of light passing through the LCD panel and thereby render images on the panel. The LCD panel may include gate driver circuitry for driving gates of thin-film transistors (TFTs) of the LCD panel. Specifically, the gate driver circuitry may select among rows of TFTs to activate to enable data to be provided to a selected row of TFTs. OLED displays may also include gate driver circuitry for selecting among rows of TFTs to activate to enable data to be provided to a selected row of TFTs. Unfortunately, the gate driver circuitry may use a high power supply voltage thereby consuming a substantial amount power. Furthermore, the gate driver circuitry may occupy a large amount of space. Accordingly, there is a need for low power techniques to improve reliability and to decrease the amount of power consumed and space used by the gate driver circuitry, and thereby decreasing the amount of power consumed and space used by an electronic display.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to various techniques, systems, devices, and methods for improving reliability and reducing power consumption of a display. Accordingly, the display for an electronic device may include multiple gate drivers. The gate drivers may be configured to use less power and consume less space than other gate drivers. For example, one gate driver may include an output node configured to be coupled to a gate line and to provide power to the gate line for driving thin-film transistor (TFT) gates of the display. The gate driver may also include an input node configured to receive an input signal, such as a clock signal. The gate driver may include a first field-effect transistor (FET) having a first gate, a first drain, and a first source. The first drain may be coupled to the input node and the first source may be coupled to the output node. The gate driver may also include a second FET having a second gate, a second drain, and a second source. The second drain may be coupled to the input node. The gate driver may include a capacitor having a first end and a second end. Moreover, the first end of the capacitor may be coupled to the first gate and the second gate. Furthermore, the second end of the capacitor may be coupled to the second source. Accordingly, power consumption of the display may be reduced.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
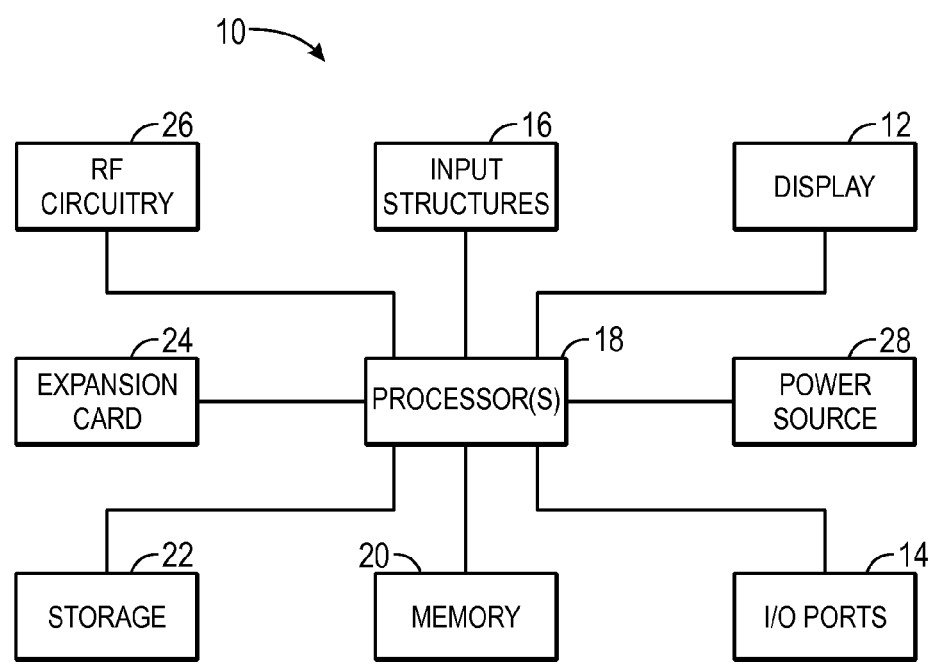
FIG. 1 illustrates a block diagram of an electronic device that may use the techniques disclosed herein, in accordance with aspects of the present disclosure.
Figure 2:
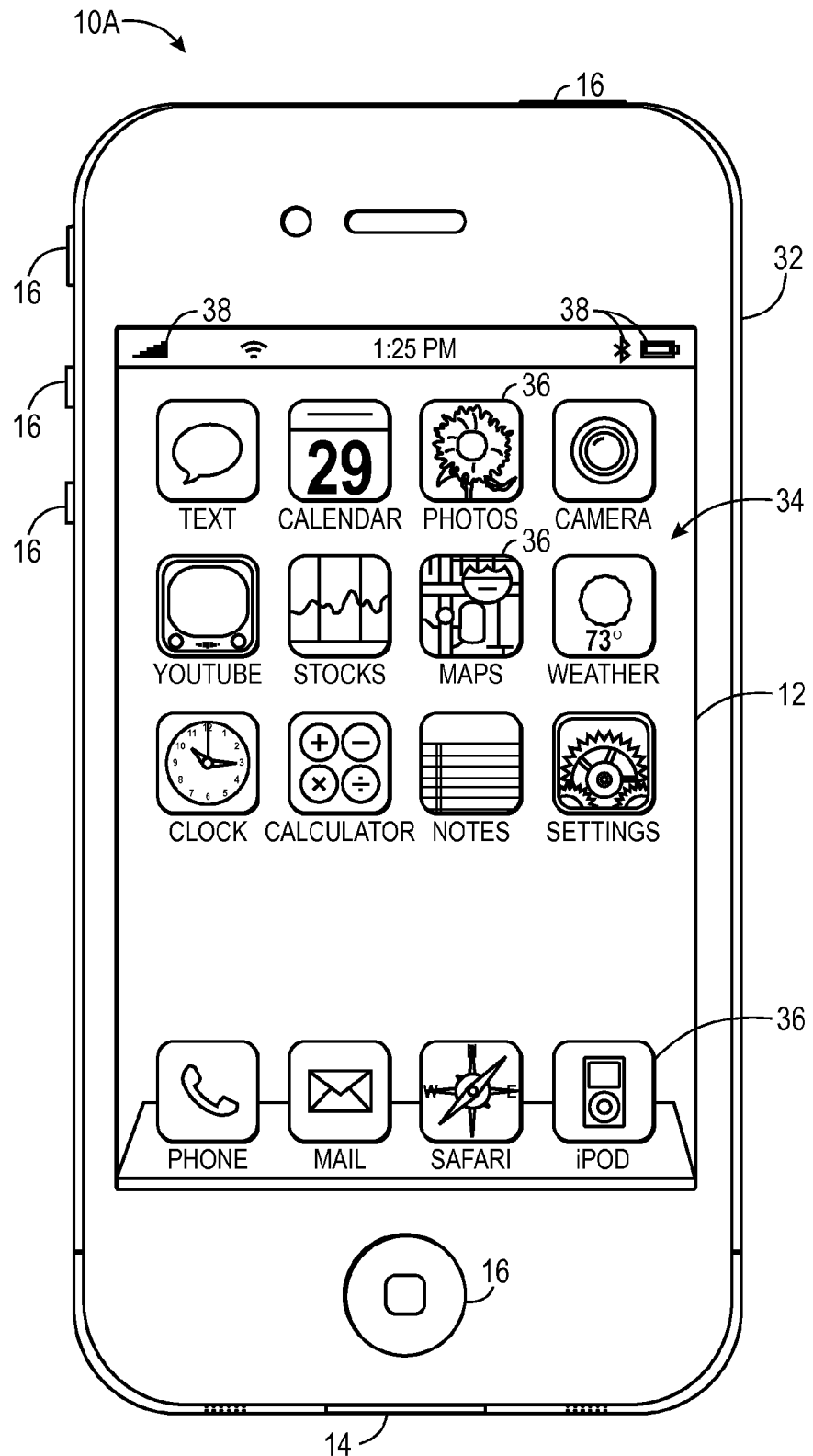
FIG. 2 illustrates a front view of a handheld device, such as an iPhone, representing another embodiment of the electronic device of FIG. 1, in accordance with an embodiment.
Figure 3:
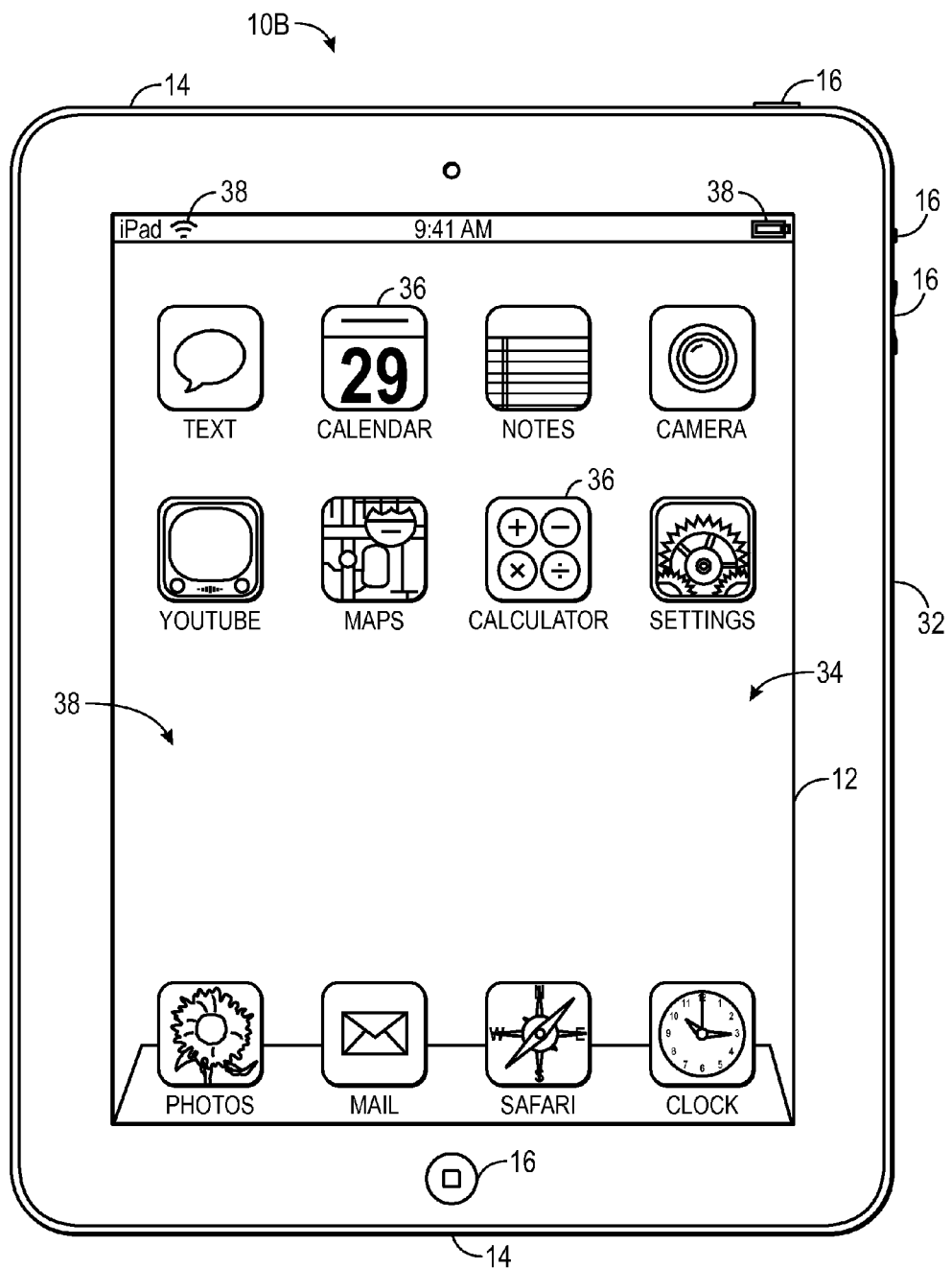
FIG. 3 illustrates a front view of a tablet device, such as an iPad, representing a further embodiment of the electronic device of FIG. 1, in accordance with an embodiment.
Figure 4:
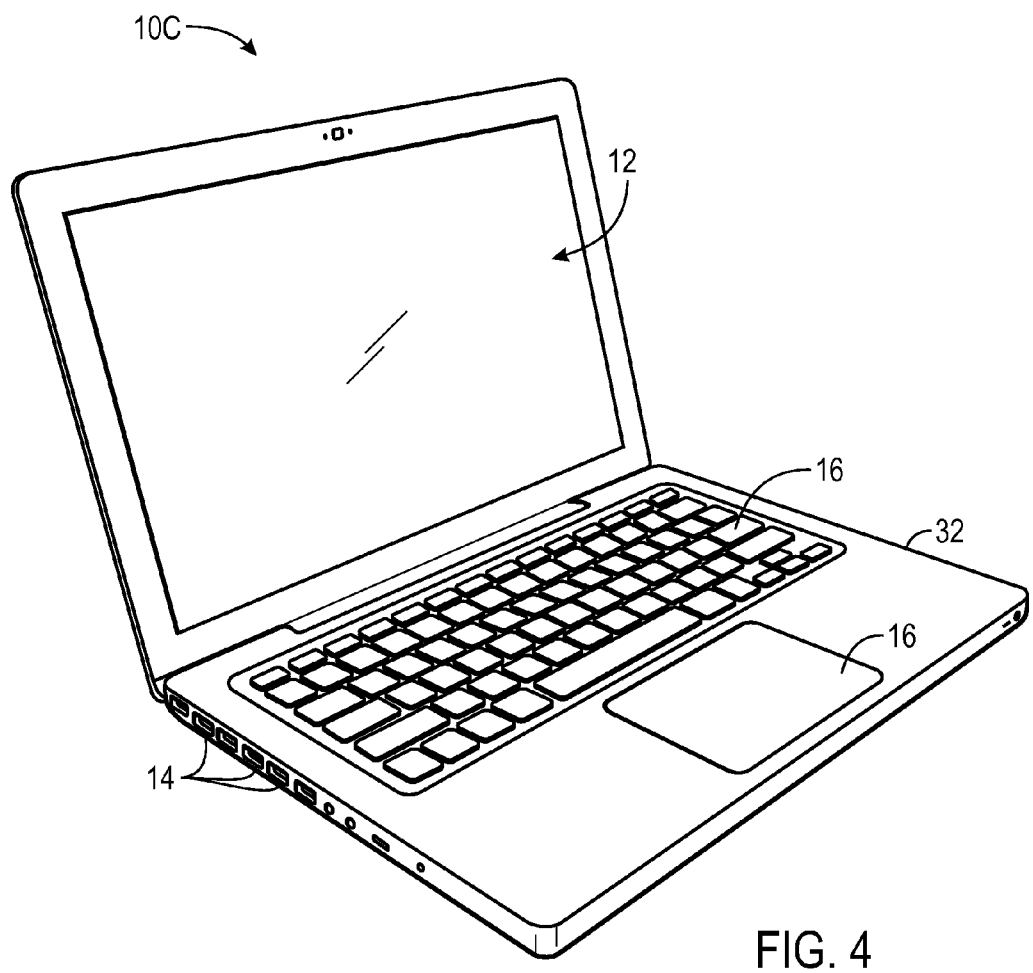
FIG. 4 illustrates a front view of a laptop computer, such as a MacBook, representing an embodiment of the electronic device of FIG. 1, in accordance with an embodiment.

With the foregoing in mind, it is useful to begin with a general description of suitable electronic devices that may employ the display devices and techniques described below. In particular, FIG. 1 is a block diagram depicting various components that may be present in an electronic device suitable for use with such display devices and techniques. FIGS. 2, 3, and 4 respectively illustrate front and perspective views of suitable electronic devices, which may be, as illustrated, a handheld electronic device, a tablet computing device, or a notebook computer.

Turning first to FIG. 1, an electronic device 10 according to an embodiment of the present disclosure may include, among other things, a display 12, input/output (I/O) ports 14, input structures 16, one or more processor(s) 18, memory 20, nonvolatile storage 22, an expansion card 24, RF circuitry 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in the electronic device 10.

By way of example, the electronic device 10 may represent a block diagram of the handheld device depicted in FIG. 2, the tablet computing device depicted in FIG. 3, the notebook computer depicted in FIG. 4, or similar devices, such as desktop computers, televisions, and so forth. It should be noted that the processor(s) 18 and/or other data processing circuitry may be generally referred to herein as "data processing circuitry." This data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 18 and/or other data processing circuitry may be operably coupled with the memory 20 and the nonvolatile storage 22 to execute instructions. Such programs or instructions executed by the processor(s) 18 may be stored in any suitable article of manufacture that includes one or more tangible non-transitory, computer-readable media at least collectively storing the instructions or routines, such as the memory 20 and the nonvolatile storage 22. The memory 20 and the nonvolatile storage 22 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor(s) 18.

In one embodiment, the display 12 may be a touch-screen liquid crystal display (LCD), for example, which may enable users to interact with a user interface of the electronic device 10. In another embodiment, the display 12 may be an organic light emitting diode (OLED) display. In some embodiments, the electronic display 12 may be a MultiTouch™ display that can detect multiple touches at once.

The input structures 16 of the electronic device 10 may enable a user to interact with the electronic device 10 (e.g., pressing a button to increase or decrease a volume level). The I/O ports 14 may enable electronic device 10 to interface with various other electronic devices, as may the expansion card 24 and/or the RF circuitry 26. The expansion card 24 and/or the RF circuitry 26 may include, for example, interfaces for a personal area network (PAN), such as a Bluetooth network, for a local area network (LAN), such as an 802.11x Wi-Fi network, and/or for a wide area network (WAN), such as a 3G or 4G cellular network. The power source 28 of the electronic device 10 may be any suitable source of power, such as a rechargeable lithium polymer (Li-poly) battery and/or an alternating current (AC) power converter.

As mentioned above, the electronic device 10 may take the form of a computer or other type of electronic device. Such computers may include computers that are generally portable (such as laptop, notebook, and tablet computers) as well as computers that are generally used in one place (such as conventional desktop computers, workstations and/or servers). FIG. 2 depicts a front view of a handheld device 10A, which represents one embodiment of the electronic device 10. The handheld device 10A may represent, for example, a portable phone, a media player, a personal data organizer, a handheld game platform, or any combination of such devices. By way of example, the handheld device 10A may be a model of an iPod® or iPhone® available from Apple Inc. of Cupertino, Calif.

The handheld device 10A may include an enclosure 32 to protect interior components from physical damage and to shield them from electromagnetic interference. The enclosure 32 may surround the display 12, which may include a screen 34 for displaying icons 36. The screen 34 may also display indicator icons 38 to indicate, among other things, a cellular signal strength, Bluetooth connection, and/or battery life. The I/O ports 14 may open through the enclosure 32 and may include, for example, a proprietary I/O port from Apple Inc. to connect to external devices.

User input structures 16, in combination with the display 12, may allow a user to control the handheld device 10A. For example, the input structures 16 may activate or deactivate the handheld device 10A, navigate a user interface to a home screen, navigate a user interface to a user-configurable application screen, activate a voice-recognition feature of the handheld device 10A, provide volume control, and toggle between vibrate and ring modes. The electronic device 10 may also be a tablet device 10B, as illustrated in FIG. 3. For example, the tablet device 10B may be a model of an iPad® available from Apple Inc.

In certain embodiments, the electronic device 10 may take the form of a computer, such as a model of a MacBook®, MacBook® Pro, MacBook Air®, iMac®, Mac® mini, or Mac Pro® available from Apple Inc. By way of example, the electronic device 10, taking the form of a notebook computer 10C, is illustrated in FIG. 4 in accordance with one embodiment of the present disclosure. The depicted computer 10C may include a housing 32, a display 12, I/O ports 14, and input structures 16. In one embodiment, the input structures 16 (such as a keyboard and/or touchpad) may be used to interact with the computer 10C, such as to start, control, or operate a GUI or applications running on computer 10C. For example, a keyboard and/or touchpad may allow a user to navigate a user interface or application interface displayed on the display 12.

Figure 5:
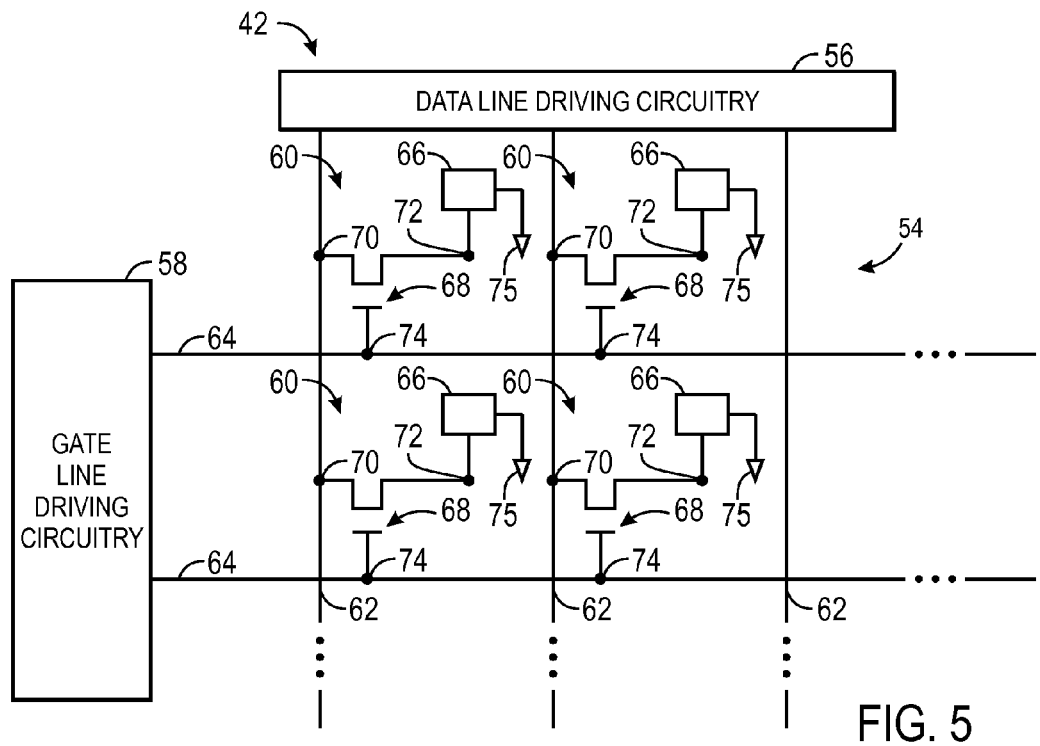
FIG. 5 illustrates circuitry that may be found in the display of FIG. 1, in accordance with an embodiment.

An electronic device 10, such as the devices 10A, 10B, and 10C discussed above, may be configured to reduce the power consumed by the display 12, such as by reducing power consumed by gate driver circuitry of the display 12. FIG. 5 illustrates pixel-driving circuitry that may be found in the display 12 and may be configured for such operation. In certain embodiments, the pixel-driving circuitry depicted in FIG. 5 may be embodied on a liquid crystal display (LCD) panel 42 of the display 12. The pixel-driving circuitry includes an array or matrix 54 of unit pixels 60 that are driven by data (or source) line driving circuitry 56 and gate (or scanning) line driving circuitry 58. The matrix 54 of unit pixels 60 may form an image display region of the display 12. In such a matrix, each unit pixel 60 may be defined by the intersection of data lines 62 and gate lines 64, which may also be referred to as source lines 62 and scanning (or video scan) lines 64. The data line driving circuitry 56 may include one or more driver integrated circuits (also referred to as column drivers) for driving the data lines 62. The gate line driving circuitry 58 may also include one or more driver integrated circuits (also referred to as row drivers or gate drivers). For example, the gate line driving circuitry 58 may include a gate driver for each gate line 64 of the LCD panel 42.

Each unit pixel 60 includes a pixel electrode 66 and a thin film transistor (TFT) 68 for switching access to the pixel electrode 66. In the depicted embodiment, a source 70 of each TFT 68 is electrically connected to a data line 62 extending from respective data line driving circuitry 56, and a drain 72 is electrically connected to the pixel electrode 66. Similarly, in the depicted embodiment, a gate 74 of each TFT 68 is electrically connected to a gate line 64 extending from respective gate line driving circuitry 58.

In one embodiment, column drivers of the data line driving circuitry 56 send image signals to the pixels via the respective data lines 62. Such image signals may be applied by line-sequence, i.e., the data lines 62 may be sequentially activated during operation. The gate lines 64 may apply scanning signals from the gate line driving circuitry 58 to the gate 74 of each TFT 68. Such gate signals may be applied by line-sequence with a predetermined timing or in a pulsed manner.

Each TFT 68 serves as a switching element which may be activated and deactivated (i.e., turned on and off) for a predetermined period based on the respective presence or absence of a gate signal at its gate 74. When activated, a TFT 68 may store the image signals received via a respective data line 62 as a charge in the pixel electrode 66 with a predetermined timing.

The image signals stored at the pixel electrode 66 may be used to generate an electrical field between the respective pixel electrode 66 and a common electrode (VCOM) 75. Such an electrical field may align liquid crystals within a liquid crystal layer to modulate light transmission through the LCD panel 42. Unit pixels 60 may operate in conjunction with various color filters, such as red, green, and blue filters. In such embodiments, a "pixel" of the display may actually include multiple unit pixels, such as a red unit pixel, a green unit pixel, and a blue unit pixel, each of which may be modulated to increase or decrease the amount of light emitted to enable the display to render numerous colors via additive mixing of the colors.

In some embodiments, a storage capacitor may also be provided in parallel to the liquid crystal capacitor formed between the pixel electrode 66 and the common electrode to prevent leakage of the stored image signal at the pixel electrode 66. For example, such a storage capacitor may be provided between the drain 72 of the respective TFT 68 and a separate capacitor line.

Figure 6:
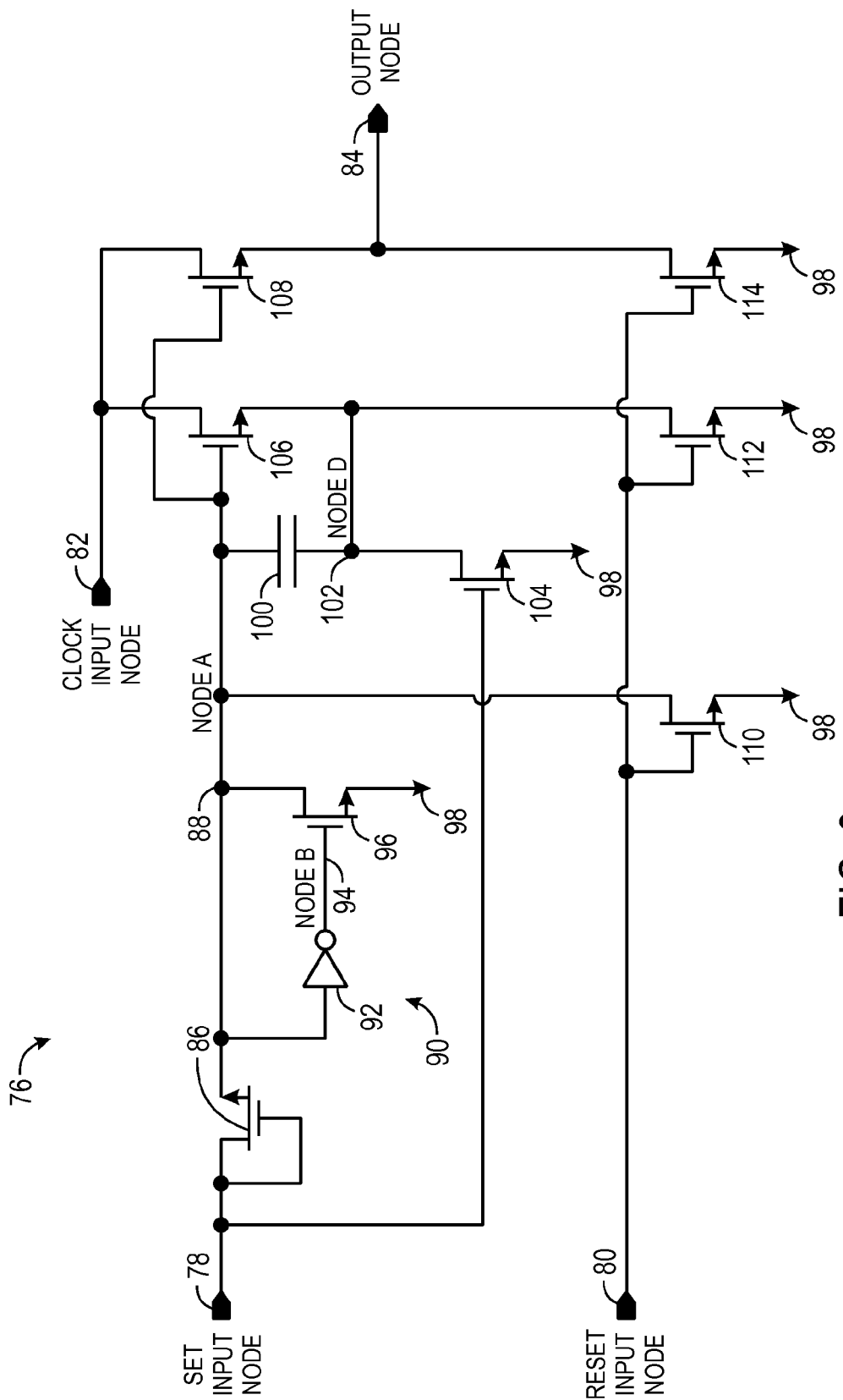
FIG. 6 illustrates gate driver circuitry that may be found in the display of FIG. 1, in accordance with an embodiment.

In certain embodiments, the gate line driving circuitry 58 may include a gate driver for driving each gate line 64 of the LCD panel 42. FIG. 6 illustrates one embodiment of a gate driver 76 that may be found in the display 12 of FIG. 1. The gate driver 76 includes various input and output nodes. Specifically, the gate driver 76 includes a set input node 78, a reset input node 80, a clock input node 82, and an output node 84. The set input node 78, the reset input node 80, and the clock input node 82 are configured to receive input signals used to produce an output signal provided to the output node 84. For example, the clock input node 82 may be configured to receive a clock input signal. As may be appreciated, a gate line 64 may be coupled to the output node 84, and the output node 84 may be configured to provide power to the gate line 64 for driving TFT gates 74 coupled to the gate line 64.

The gate driver 76 includes a first field-effect transistor (FET) 86 having a gate and a drain coupled to the set input node 78, and a source coupled to a node A 88. As such, while a logic high is provided to the set input node 78, the gate of the first FET 86 is activated thereby enabling the logic high to be provided to the node A 88. As used herein, a "logic high" is considered a voltage sufficient to activate the gate of a FET. Conversely, a "logic low" is considered a voltage insufficient to activate the gate of a FET.

As illustrated, a latching circuit 90 is also coupled to the node A 88. Specifically, the latching circuit 90 includes an inverter 92 having an input coupled to the node A 88 and an output coupled to a node B 94. Furthermore, the latching circuit 90 includes a second FET 96 having a drain coupled to the node A 88, a gate coupled to the node B 94, and a source coupled to a common reference node 98. Thus, while a logic high is provided to the node A 88, a logic low is provided to the node B 94. Moreover, while a logic low is provided to the node A 88, a logic high is provided to the node B 94, thereby facilitating a conductive path between the node A 88 and the common reference node 98.

The gate driver 76 also includes a capacitor 100 coupled between the node A 88 and a node D 102. In addition, a third FET 104 includes a drain coupled to the node D 102, a gate coupled to the set input node 78, and a source coupled to the common reference node 98. Accordingly, a logic high provided to the set input node 78 facilitates a conductive path between the node D 102 and the common reference node 98. Thus, the logic high on the node A 88 is used to charge the capacitor 100.

The gate driver 76 includes a fourth FET 106 having a drain coupled to the clock input node 82, a gate coupled to the node A 88, and a source coupled to the node D 102. Thus, while charged, the capacitor 100 may be used to provide a logic high to the gate of the fourth FET 106. Furthermore, while a positive clock pulse is provided to the drain of the fourth FET 106, the capacitor 100 is boosted up (i.e., bootstrapped), thereby boosting the logic high on the node A 88 with an even higher positive voltage. Accordingly, the capacitor 100 acts as a bootstrapping device. As illustrated, the gate driver 76 also includes a fifth FET 108 having a drain coupled to the clock input node 82, a gate coupled to the node A 88, and a source coupled to the output node 84. Therefore, while a logic high is applied to the node A 88, a clock pulse received by the clock input node 82 is provided to the output node 84.

As may be appreciated, the capacitive load driven by the output node 84 may be approximately 100 to 1000 times larger than the capacitive load of the capacitor 100. As such, the fourth FET 106 may be sized to be smaller than the fifth FET 108. For example, in certain embodiments, the fourth FET 106 may be sized to be smaller than the fifth FET 108 by approximately 5 to 10 times. Furthermore, the capacitor 100 may be smaller in the illustrated embodiment than in embodiments in which the fourth FET 106 and the fifth FET 108 are replaced by a single FET. For example, the capacitor 100 may be approximately 2 to 3 times smaller in the illustrated embodiment than in embodiments in which the fourth FET 106 and the fifth FET 108 are replaced by a single FET. In certain embodiments, the capacitor 100 may have a capacitance of approximately 0.5 to 5.0 pF. For example, in certain embodiments, the capacitor 100 may have a capacitance of approximately 1.0 pF. It should be noted that the bootstrapping arrangement described in the illustrated embodiment is more robust than in embodiments in which the fourth FET 106 and the fifth FET 108 are replaced by a single FET.

The gate driver 76 includes a sixth FET 110 having a drain coupled to the node A 88, a gate coupled to the reset input node 80, and a source coupled to the common reference node 98. Accordingly, a logic high provided to the reset input node 80 facilitates conductivity between the node A 88 and the common reference node 98. Furthermore, the gate driver 76 includes a seventh FET 112 having a drain coupled to the node D 102, a gate coupled to the reset input node 80, and a source coupled to the common reference node 98. Therefore, a logic high provided to the reset input node 80 facilitates conductivity between the node D 102 and the common reference node 98. In addition, the gate driver 76 includes an eighth FET 114 having a drain coupled to the output node 84, a gate coupled to the reset input node 80, and a source coupled to the common reference node 98. Accordingly, a logic high provided to the reset input node 80 facilitates conductivity between the output node 84 and the common reference node 98.

As may be appreciated, one or more of the FETs described herein may be a metal-oxide-semiconductor FET (MOSFET), an n-channel MOSFET (NMOS), a p-channel MOSFET (PMOS), or any suitable FET. Furthermore, the common reference node 98 may be configured to receive any suitable voltage. For example, the common reference node 98 may be configured to receive a low voltage, a negative voltage, a ground voltage, and so forth. In certain embodiments, the common reference node 98 may be configured to receive approximately −7.0 volts. Moreover, the clock pulses (e.g., clock signal) received by the clock input node 82 may be any suitable voltages. For example, in certain embodiments, the clock pulses may include a low voltage of approximately −7.0 volts and a high voltage of approximately 20.0 volts.

Figure 7:
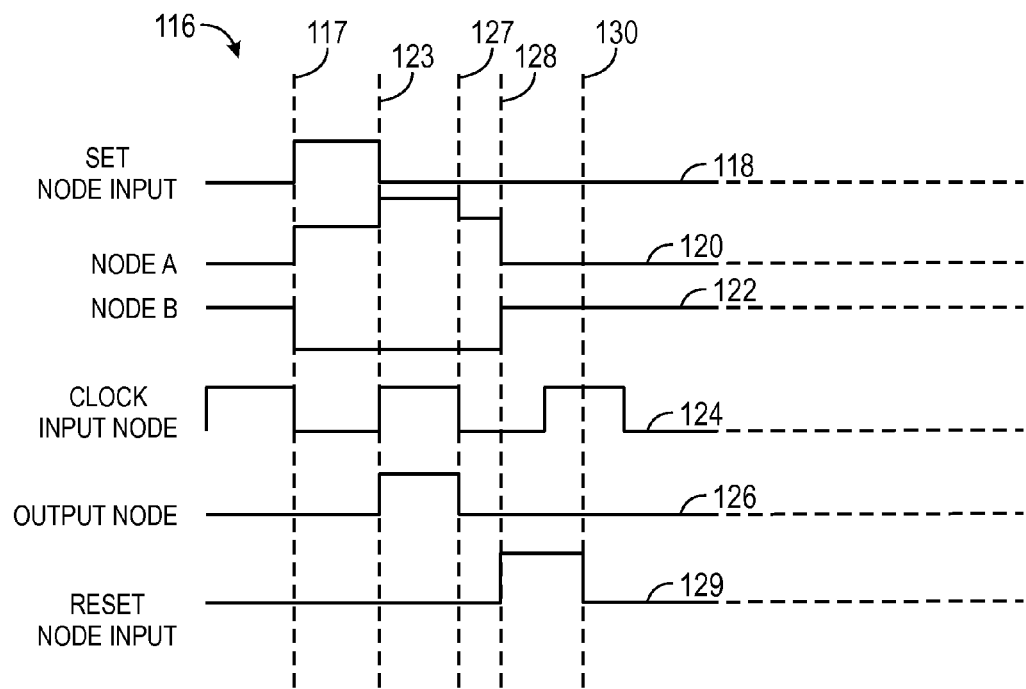
FIG. 7 illustrates a timing diagram of signals that may be used to drive the gate driver circuitry of FIG. 6, in accordance with an embodiment.

A timing diagram 116 of signals that may be used to drive the gate driver circuitry of FIG. 6 is shown in FIG. 7. As illustrated, a logic high is provided at a time 117 to the set input node 78 using a signal 118. This logic high turns on (i.e., activates) the first FET 86 and the third FET 104, thereby charging the capacitor 100. Accordingly, a logic high is present on the node A 88 as illustrated by a signal 120. Furthermore, the logic high on the node A 88 drives the node B 94 to a logic low as shown by a signal 122. The logic high on the node A 88 also turns on the fourth FET 106 and the fifth FET 108. At a time 123, a logic low is provided to the set input node 78 by the signal 118 and the clock input node 82 receives a high voltage from a clock pulse as shown by a signal 124. This results in the signal 120 found on the node A 88 being driven to a higher voltage and the signal 122 found on the node B 122 being maintained at a logic low. Furthermore, a signal 126 present on the output node 84 is driven to a logic high, thereby activating gates of a gate line.

Moreover, at a time 127 the clock input node 82 receives a low voltage from the clock pulse as shown by the signal 124, resulting in a logic low on the output node 84 as illustrated by the signal 126. As illustrated, the signal 120 on the node A 88 remains a logic high. A logic high is received by the reset input node 80 at a time 128 as shown by a signal 129. This logic high turns on the sixth FET 110, the seventh FET 112, and the eighth FET 114, thereby enabling a conductive path between the node A 88 and the common reference node 98, the node D 102 and the common reference node 98, and the output node 84 and the common reference node 98. Accordingly, the signal 120 on the node A 88 reduces to a logic low, thereby driving the signal 122 on the node B 94 to a logic high. With the signal 122 at a logic high, the second FET 96 is turned on, thereby enabling a conductive path between the node A 88 and the common reference node 98. In addition, with the signal 120 at a logic low, the fourth FET 106 and the fifth FET 108 are turned off (e.g., deactivated). At a time 130, the signal 129 on the reset input node 80 returns to a logic low.

Figure 8:
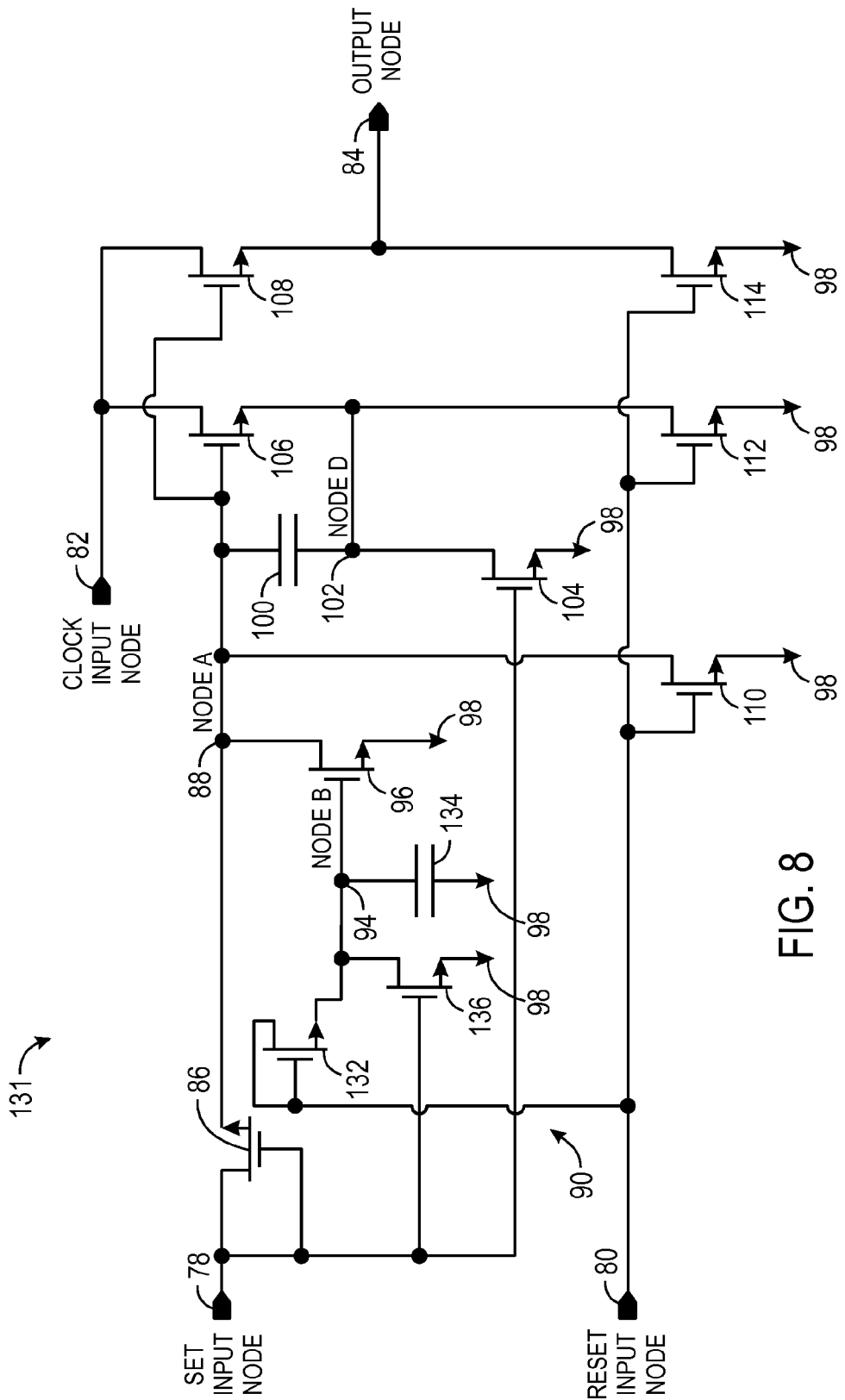
FIG. 8 illustrates gate driver circuitry that may be found in the display of FIG. 1, in accordance with an embodiment.

As may be appreciated, the latching circuit 90 may be designed in a number of different ways. FIG. 8 illustrates another embodiment of a gate driver 131 that may be found in the display 12 of FIG. 1. In the illustrated embodiment, the gate driver 131 includes many features that are similar to the embodiment of the gate driver 76 described in FIG. 6. However, in the illustrated embodiment of FIG. 8, the latching circuit 90 is modified to reduce power consumption.

Specifically, the second FET 96 is turned on by a logic high signal provided to the reset input node 80. A ninth FET 132 is turned on by the logic high on the reset input node 80, thereby charging a capacitor 134 and resulting in a logic high on the node B 94. After the reset input node 80 returns to a logic low, a logic high is maintained on the node B 94 by the capacitor 134, thereby holding the second FET 96 on. Moreover, the second FET 96 is turned off by a logic high on the set input node 78.

A tenth FET 136 is turned on by the logic high on the set input node 78, thereby enabling a conductive path between the node B 94 and the common reference node 98. Accordingly, the latching circuit 90 consumes power while a logic high is provided to the set input node 78 or while a logic high is provided to the reset input node 80. The power reduction is facilitated by the latching circuit 90 using the capacitor 134 to keep the second FET 96 on. As may be appreciated, the timing operation of the gate driver 131 operates similarly to the timing illustrated in FIG. 7.

As described in FIGS. 6 and 8, the latching circuit 90 includes the second FET 96 that enables a conductive path between the node A 88 and the common reference node 98. As illustrated in FIG. 7, the second FET 96 is turned on except while the set input node 78 and clock input node 82 receive logic high signals. Accordingly, the duty cycle on the gate of the second FET 96 is high. This may impact the reliability of the second FET 96 due to the threshold voltage drift effect. The duty cycle of the second FET 96 may be reduced by replacing the second FET 96 with multiple FETs that share the combined duty cycle, as illustrated by a gate driver 138 of FIG. 9 that may be found in the display 12 of FIG. 1.

Figure 9:
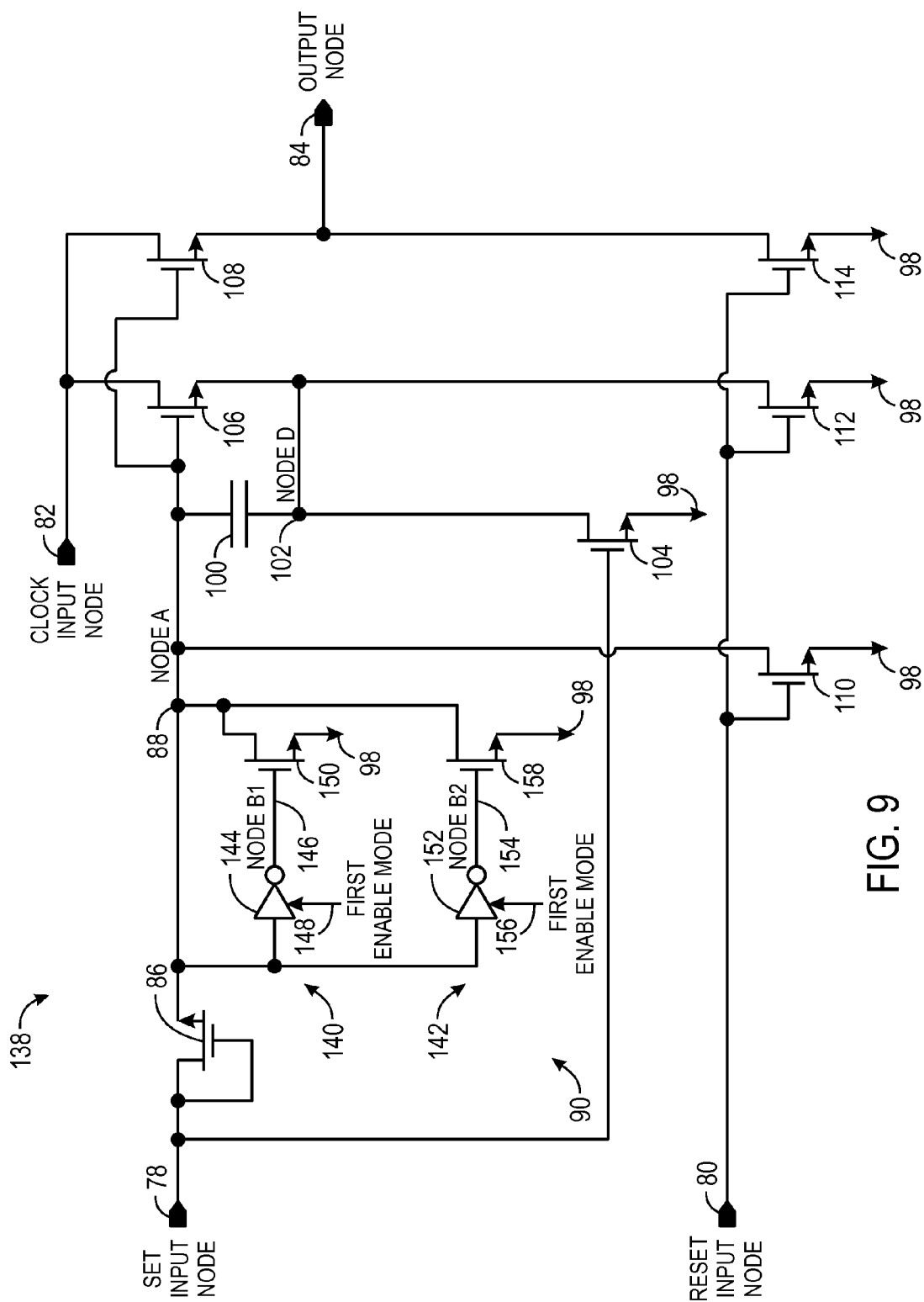
FIG. 9 illustrates gate driver circuitry that may be found in the display of FIG. 1, in accordance with an embodiment.

The latching circuit 90 of FIG. 9 includes a first latching circuit 140 and a second latching circuit 142. Moreover, the first latching circuit 140 includes a first inverter 144 having an input coupled to the node A 88 and an output coupled to a node B1 146. A first enable node 148 is coupled to the first inverter 144 and is used to provide an enable signal to the first inverter 144. Furthermore, the first latching circuit 140 includes a first latching FET 150 having a drain coupled to the node A 88, a gate coupled to the node B1 146, and a source coupled to the common reference node 98. Thus, while a logic high is provided to the node A 88, a logic low is provided to the node B1 146 if a logic high is provided to the first enable node 148. Moreover, while a logic low is provided to the node A 88, a logic high is provided to the node B1 146 if a logic high is provided to the first enable node 148, thereby facilitating conductivity between the node A 88 and the common reference node 98.

In addition, the second latching circuit 142 includes a second inverter 152 having an input coupled to the node A 88 and an output coupled to a node B2 154. A second enable node 156 is coupled to the second inverter 152 and is used to provide an enable signal to the second inverter 152. Furthermore, the second latching circuit 142 includes a second latching FET 158 having a drain coupled to the node A 88, a gate coupled to the node B2 154, and a source coupled to the common reference node 98. Thus, while a logic high is provided to the node A 88, a logic low is provided to the node B2 154 if a logic high is provided to the second enable node 156. Moreover, while a logic low is provided to the node A 88, a logic high is provided to the node B2 154 if a logic high is provided to the second enable node 156, thereby facilitating conductivity between the node A 88 and the common reference node 98.

By using the first and second latching circuits 140 and 142, the time used to facilitate conductivity between the node A 88 and the common reference node 98 is split between the first latching FET 150 and the second latching FET 158, thereby increasing the usable life of the gate driver 138 (e.g., by two times). As may be appreciated, more than two latching circuits may be used by the gate driver 138 to split component power on time among a greater number of components.

Figure 10:
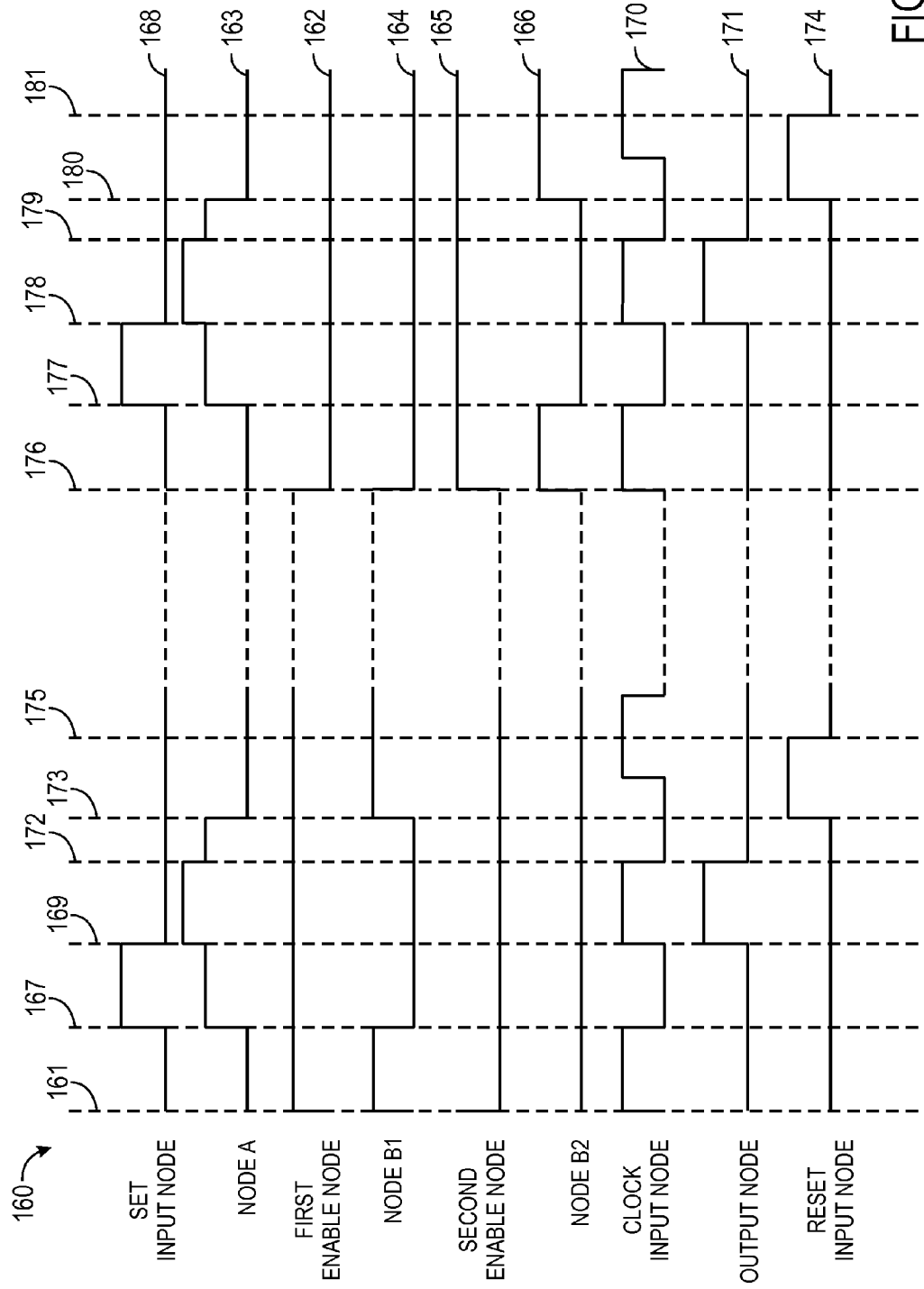
FIG. 10 illustrates a timing diagram of signals that may be used to drive the gate driver circuitry of FIG. 9, in accordance with an embodiment.

A timing diagram 160 of signals that may be used to drive the gate driver 138 of FIG. 9 is illustrated in FIG. 10. As illustrated, a logic high is provided at a time 161 to the first enable node 148 using a signal 162, thereby enabling the first inverter 144. Accordingly, with a logic low provided to the node A 88 using a signal 163, a logic high is provided to the node B1 146 using a signal 164. With the signal 164 at a logic high, the first latching FET 150 is turned on, thereby enabling a conductive path between the node A 88 and the common reference node 98. Furthermore, a logic low is provided at the time 161 to the second enable node 156 using a signal 165, resulting in a logic low provided to the node B2 154 using a signal 166.

A logic high is provided at a time 167 to the set input node 78 using a signal 168. This logic high turns on the first FET 86 and the third FET 104, thereby charging the capacitor 100. Accordingly, a logic high is present on the node A 88 as illustrated by the signal 163. Furthermore, the logic high on the node A 88 drives the node B1 146 to a logic low as shown by the signal 164. The logic high on the node A 88 also turns on the fourth FET 106 and the fifth FET 108. At a time 169, a logic low is provided to the set input node 78 by the signal 168 and the clock input node 82 receives a high voltage from a clock pulse as shown by a signal 170. This results in the signal 163 found on the node A 88 being driven to a higher voltage and the signal 164 found on the node B1 146 being maintained at a logic low. Furthermore, a signal 171 present on the output node 84 is driven to a logic high, thereby activating gates of a gate line.

Moreover, at a time 172 the clock input node 82 receives a low voltage from the clock pulse as shown by the signal 170, resulting in a logic low on the output node 84 as illustrated by the signal 171. As illustrated, the signal 163 on the node A 88 drops by approximately half of its prior voltage and may remain a logic high. A logic high is received by the reset input node 80 at a time 173 as shown by a signal 174. This logic high turns on the sixth FET 110, the seventh FET 112, and the eighth FET 114, thereby enabling a conductive path between the node A 88 and the common reference node 98, the node D 102 and the common reference node 98, and the output node 84 and the common reference node 98. Accordingly, the signal 163 on the node A 88 reduces to a logic low, thereby driving the signal 164 on the node B1 146 to a logic high. With the signal 164 at a logic high, the first latching FET 150 is turned on, thereby enabling a conductive path between the node A 88 and the common reference node 98. In addition, with the signal 163 at a logic low, the fourth FET 106 and the fifth FET 108 are turned off At a time 175, the signal 174 on the reset input node 80 returns to a logic low.

As may be appreciated, a time may elapse between the time 175 and a time 176, such that a time between the time 161 and the time 176 corresponds to one or more frames, or any suitable predetermined period of time. As illustrated, a logic high is provided at the time 176 to the second enable node 156 using the signal 165, thereby enabling the second inverter 152. Accordingly, with a logic low provided to the node A 88 using the signal 163, a logic high is provided to the node B2 154 using the signal 166. With the signal 166 at a logic high, the second latching FET 158 is turned on, thereby enabling a conductive path between the node A 88 and the common reference node 98. Furthermore, a logic low is provided at the time 176 to the first enable node 148 using the signal 162, resulting in a logic low provided to the node B1 146 using the signal 164.

A logic high is provided at a time 177 to the set input node 78 using the signal 168. This logic high turns on the first FET 86 and the third FET 104, thereby charging the capacitor 100. Accordingly, a logic high is present on the node A 88 as illustrated by the signal 163. Furthermore, the logic high on the node A 88 drives the node B2 154 to a logic low as shown by the signal 166. The logic high on the node A 88 also turns on the fourth FET 106 and the fifth FET 108. At a time 178, a logic low is provided to the set input node 78 by the signal 168 and the clock input node 82 receives a high voltage from a clock pulse as shown by the signal 170. This results in the signal 163 found on the node A 88 being driven to a higher voltage and the signal 166 found on the node B2 154 being maintained at a logic low. Furthermore, the signal 171 present on the output node 84 is driven to a logic high, thereby activating gates of a gate line.

Moreover, at a time 179 the clock input node 82 receives a low voltage from the clock pulse as shown by the signal 170, resulting in a logic low on the output node 84 as illustrated by the signal 171. As illustrated, the signal 163 on the node A 88 drops by approximately half of its prior voltage and may remain a logic high. A logic high is received by the reset input node 80 at a time 180 as shown by the signal 174. This logic high turns on the sixth FET 110, the seventh FET 112, and the eighth FET 114, thereby enabling a conductive path between the node A 88 and the common reference node 98, the node D 102 and the common reference node 98, and the output node 84 and the common reference node 98. Accordingly, the signal 163 on the node A 88 reduces to a logic low, thereby driving the signal 166 on the node B2 154 to a logic high. With the signal 166 at a logic high, the second latching FET 158 is turned on, thereby enabling a conductive path between the node A 88 and the common reference node 98. In addition, with the signal 163 at a logic low, the fourth FET 106 and the fifth FET 108 are turned off At a time 181, the signal 174 on the reset input node 80 returns to a logic low. Accordingly, enabling a conductive path between the node A 88 and the common voltage node 98 is split between multiple FETs, thereby increasing the overall power on time that may be used by the gate driver 138.

Figure 11:
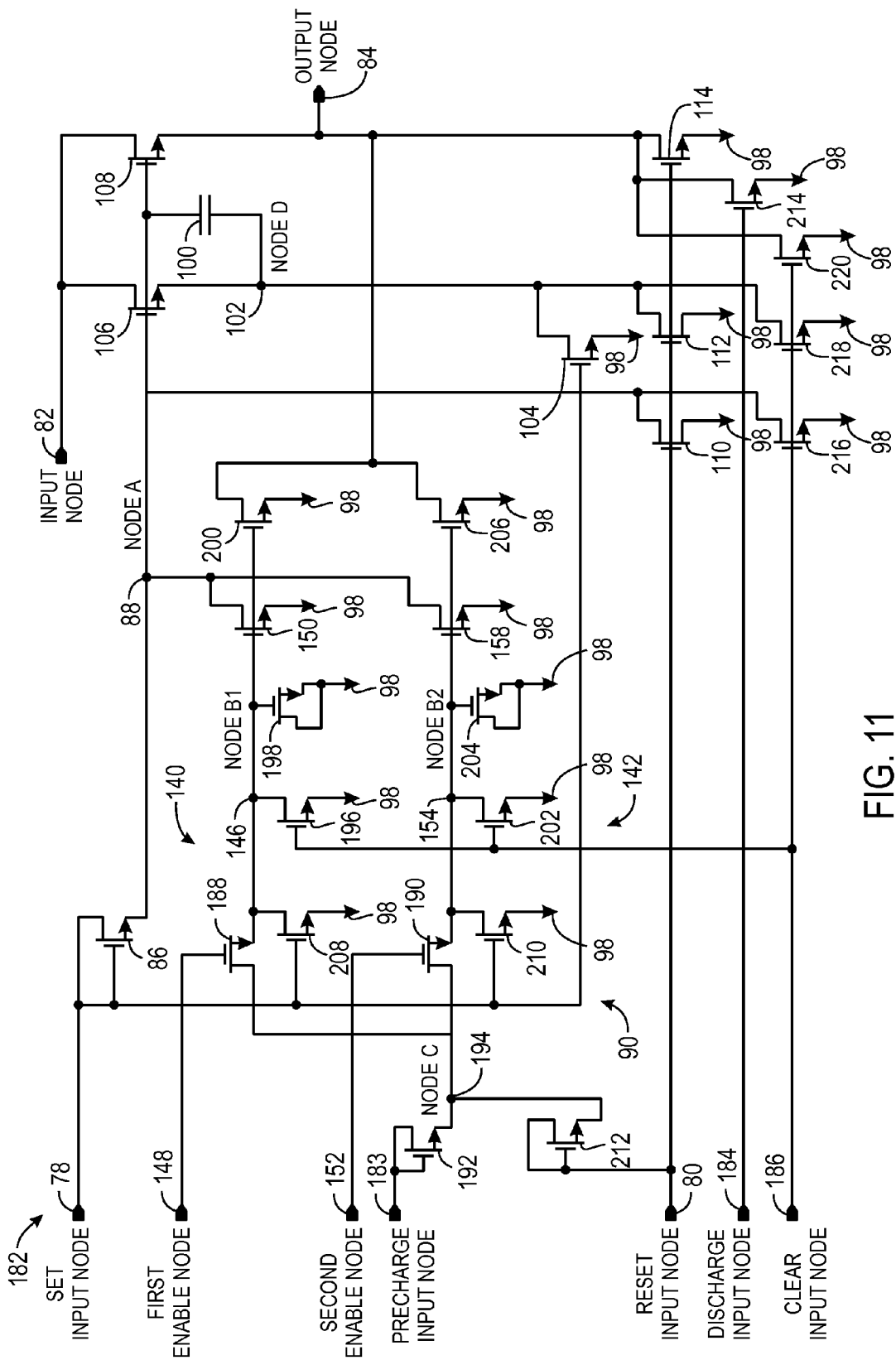
FIG. 11 illustrates gate driver circuitry that may be found in the display of FIG. 1, in accordance with an embodiment.

In certain embodiments, multiple clock signals are used to provide clock inputs to one single gate driver. For example, in one embodiment, a single gate driver may use up to four different clocks at four different phases. In other embodiments, a single clock signal may be used to provide a clock input to each of the gate drivers. For example, a display 12 may include four clocks at four different phases. However, only one of the four clocks may be used for each of the gate drivers. One embodiment of a gate driver 182 designed to use a single clock signal for each gate driver of a display 12 is illustrated in FIG. 11.

The gate driver 182 includes a precharge input node 183, a discharge input node 184, and a clear input node 186, in addition to the set input node 78, the reset input node 80, the clock input node 82, the output node 84, the first enable node 148, and the second enable node 156. As illustrated, the first latching circuit 140 includes a first enabling FET 188 and the second latching circuit 142 includes a second enabling FET 190. The first enable node 148 is coupled to the gate of the first enabling FET 188 and the second enable node 156 is coupled to the gate of the second enabling FET 190.

A precharge FET 192 includes a gate and a drain coupled to the precharge input node 183. Furthermore, the precharge FET 192 includes a source coupled to a node C 194. The node C 194 is also coupled to the drain of the first enabling FET 188 and to the drain of the second enabling FET 190. The source of the first enabling FET 188 is coupled to the node B1 146. The first latching circuit 140 includes a first clearing FET 196 having a gate coupled to the clear input node 186, a drain coupled to the node B1 146, and a source coupled to the common reference node 98. The first latching circuit 140 also includes a first capacitive FET 198 having a gate coupled to the node B1 146, a drain coupled to the common reference node 98, and a source coupled to the common reference node 98. The first capacitive FET 198 may be charged by applying a logic high to its gate. While charged, the first capacitive FET 198 may operate as a capacitor and provide a logic high to the first latching FET 150. As may be appreciated, the first capacitive FET 198 may be any suitable FET configured to operate as a capacitor. The first latching circuit 140 also includes a FET 200 having a gate coupled to the node B1 146, a drain coupled to the output node 84, and a source coupled to the common reference node 98.

The source of the second enabling FET 190 is coupled to the node B2 154. The second latching circuit 142 includes a second clearing FET 202 having a gate coupled to the clear input node 186, a drain coupled to the node B2 154, and a source coupled to the common reference node 98. The second latching circuit 142 also includes a second capacitive FET 204 having a gate coupled to the node B2 154, a drain coupled to the common reference node 98, and a source coupled to the common reference node 98. The second capacitive FET 204 may be charged by applying a logic high to its gate. While charged, the second capacitive FET 204 may operate as a capacitor and provide a logic high to the second latching FET 158. As may be appreciated, the second capacitive FET 204 may be any suitable FET configured to operate as a capacitor. The second latching circuit 142 also includes a FET 206 having a gate coupled to the node B2 154, a drain coupled to the output node 84, and a source coupled to the common reference node 98.

The gate driver 182 includes a FET 208 has a gate coupled to the set input node 78, a drain coupled to the node B1 146, and a source coupled to the common reference node 98. Furthermore, the gate driver 182 includes a FET 210 has a gate coupled to the set input node 78, a drain coupled to the node B2 154, and a source coupled to the common reference node 98. In addition, a reset FET 212 has a gate coupled to the reset input node 80, a drain coupled to the reset input node 80, and a source coupled to the node C 194.

The gate driver 182 includes a discharging FET 214 having a gate coupled to the discharge input node 184, a drain coupled to the output node 84, and a source coupled to the common reference node 98. In addition, the gate driver 182 includes a first clearing FET 216 having a gate coupled to the clear input node 186, a drain coupled to the node A 88, and a source coupled to the common reference node 98. Moreover, the gate driver 182 also includes a second clearing FET 218 having a gate coupled to the clear input node 186, a drain coupled to the node D 102, and a source coupled to the common reference node 98. Furthermore, the gate driver 182 includes a third clearing FET 220 having a gate coupled to the clear input node 186, a drain coupled to the output node 84, and a source coupled to the common reference node 98.

Figure 12:
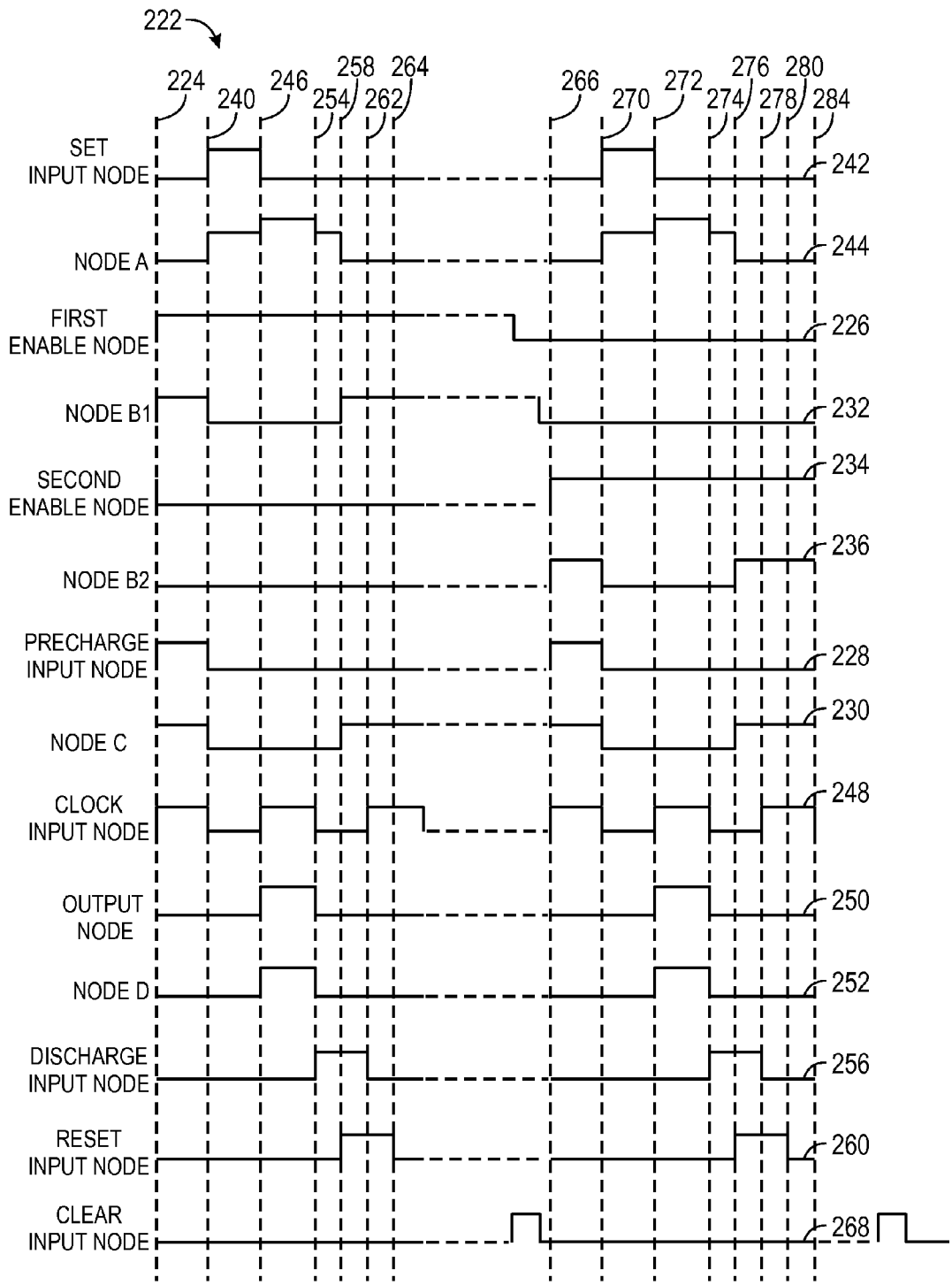
FIG. 12 illustrates a timing diagram of signals that may be used to drive the gate driver circuitry of FIG. 11, in accordance with an embodiment.

The operation of the gate driver 182 is described herein in conjunction with a timing diagram 222 illustrated in FIG. 12. As illustrated, a logic high is provided at a time 224 to the first enable node 148 using a signal 226, thereby turning on the first enabling FET 188. Furthermore, a logic high is provided at the time 224 to the precharge input node 183 using a signal 228, thereby turning on the precharge FET 192. A signal 230 at the node C 194 is a logic high while the first capacitive FET 198 is charged. Furthermore, a signal 232 on the node B1 146 is a logic high while the first capacitive FET 198 is charged. The logic high on the node B1 146 turns on the first latching FET 150, thereby enabling a conductive path between the node A 88 and the common reference node 98. In addition, the logic high on the node B1 146 turns on the FET 200, thereby enabling a conductive path between the output node 84 and the common reference node 98. Furthermore, a logic low is provided at the time 224 to the second enable node 156 using a signal 234, thereby turning off the second enabling FET 190. With the second enabling FET 190 turned off, a signal 236 on the node B2 154 is determined by whether the second capacitive FET 204 is charged. In certain embodiments, the initial voltage of the node B1 146 and the node B2 154 are set to a voltage present on the common reference node 98 unless the node B1 146 or the node B2 154 is charged by the precharge input node 183, thereby improving the lifetime of certain FETs, such as FET 200 and FET 206. In the illustrated embodiment, the second capacitive FET 204 is discharged, thereby turning off the second latching FET 158. At a time 240, the signal 228 on the precharge input node 183 transitions to a logic low.

A logic high is provided at the time 240 to the set input node 78 using a signal 242. This logic high turns on the first FET 86 and the third FET 104, thereby charging the capacitor 100. Furthermore, the signal 242 turns on the FETs 208 and 210, thereby discharging the first and second capacitive FETS 198 and 204 and pulling the nodes B1 and B2 146 and 154 to a logic low. With the capacitor 100 charged, a logic high is present on the node A 88 as illustrated by a signal 244. The logic high on the node A 88 turns on the fourth FET 106 and the fifth FET 108. At a time 246, a logic low is provided to the set input node 78 by the signal 242 and the clock input node 82 receives a high voltage from a clock pulse as shown by a signal 248. This results in the signal 244 found on the node A 88 being driven to a higher voltage. Furthermore, a signal 250 present on the output node 84 is driven to a logic high, thereby activating gates of a gate line. In addition, a signal 252 on the node D 102 is a logic high.

Moreover, at a time 254 the clock input node 82 receives a low voltage from the clock pulse as shown by the signal 248, resulting in a logic low on the output node 84 as illustrated by the signal 250 and a logic low on the node D 102 as illustrated by the signal 252.

A logic high is also received by the discharge input node 184 at the time 254 as shown by a signal 256. This logic high turns on the discharging FET 214, thereby enabling a conductive path between the output node 84 and the common voltage node 98. At a time 258, a logic high is received by the reset input node 80 as shown by a signal 260. This logic high turns on the sixth FET 110, the seventh FET 112, and the eighth FET 114, thereby enabling a conductive path between the node A 88 and the common reference node 98, the node D 102 and the common reference node 98, and the output node 84 and the common reference node 98. Thus, the signal 244 on the node A 88 reduces to a logic low. With the signal 244 at a logic low the fourth FET 106 and the fifth FET 108 are turned off. Furthermore, the logic high on the reset input node 80 turns on the reset FET 212, thereby transitioning the signal 230 on the node C 194 to a logic high, charging the first capacitive FET 198, and transitioning the signal 232 on the node B1 146 to a logic high. Accordingly, the first latching FET 150 is turned on, thereby enabling a conductive path between the node A 88 and the common reference node 98. At a time 262, the signal 256 on the discharge input node 184 returns to a logic low. Moreover, at a time 264, the signal 260 on the reset input node 80 returns to a logic low.

As may be appreciated, a time may elapse between the time 264 and a time 266, such that a time between the time 224 and the time 266 corresponds to one or more frames, or any suitable predetermined period of time. As illustrated, a logic low is provided before the time 266 to the first enable node 148 using the signal 226, thereby turning off the first enabling FET 188. With the first enabling FET 188 turned off, the signal 232 on the node B1 146 is discharged by a logic high on a signal 268 of the clear input node 186. In the illustrated embodiment, the first capacitive FET 198 is discharged, thereby turning off the first latching FET 150.

Furthermore, a logic high is provided at the time 266 to the second enable node 156 using the signal 234, thereby turning on the second enabling FET 190. Furthermore, a logic high is provided at the time 266 to the precharge input node 183 using the signal 228, thereby turning on the precharge FET 192. The signal 230 at the node C 194 remains a logic high while the second capacitive FET 204 is charged. Furthermore, the signal 236 on the node B2 154 is a logic high while the second capacitive FET 204 is charged. The logic high on the node B2 154 turns on the second latching FET 158, thereby enabling a conductive path between the node A 88 and the common reference node 98. In addition, the logic high on the node B2 154 turns on the FET 206, thereby enabling a conductive path between the output node 84 and the common reference node 98. At a time 270, the signal 228 on the precharge input node 183 transitions to a logic low.

A logic high is provided at the time 270 to the set input node 78 using the signal 242. This logic high turns on the first FET 86 and the third FET 104, thereby charging the capacitor 100. Furthermore, the signal 242 turns on the FETs 208 and 210, thereby discharging the first and second capacitive FETS 198 and 204 and pulling the nodes B1 and B2 146 and 154 to a logic low. With the capacitor 100 charged, a logic high is present on the node A 88 as illustrated by a signal 244. The logic high on the node A 88 turns on the fourth FET 106 and the fifth FET 108. At a time 272, a logic low is provided to the set input node 78 by the signal 242 and the clock input node 82 receives a high voltage from a clock pulse as shown by the signal 248. This results in the signal 244 found on the node A 88 being driven to a higher voltage. Furthermore, the signal 250 present on the output node 84 is driven to a logic high, thereby activating gates of a gate line. In addition, the signal 252 on the node D 102 is a logic high.

Moreover, at a time 274 the clock input node 82 receives a low voltage from the clock pulse as shown by the signal 248, resulting in a logic low on the output node 84 as illustrated by the signal 250 and a logic low on the node D 102 as illustrated by the signal 252.

A logic high is also received by the discharge input node 184 at the time 274 as shown by the signal 256. This logic high turns on the discharging FET 214, thereby enabling a conductive path between the output node 84 and the common voltage node 98. At a time 276, a logic high is received by the reset input node 80 as shown by the signal 260. This logic high turns on the sixth FET 110, the seventh FET 112, and the eighth FET 114, thereby enabling a conductive path between the node A 88 and the common reference node 98, the node D 102 and the common reference node 98, and the output node 84 and the common reference node 98. Thus, the signal 244 on the node A 88 reduces to a logic low. With the signal 244 at a logic low the fourth FET 106 and the fifth FET 108 are turned off. Furthermore, the logic high on the reset input node 80 turns on the reset FET 212, thereby transitioning the signal 230 on the node C 194 to a logic high, charging the second capacitive FET 204, and transitioning the signal 236 on the node B2 154 to a logic high. Accordingly, the second latching FET 158 is turned on, thereby enabling a conductive path between the node A 88 and the common reference node 98. At a time 278, the signal 256 on the discharge input node 184 returns to a logic low.

Moreover, at a time 280, the signal 260 on the reset input node 80 returns to a logic low. In addition, after a time 284 the signal 268 on the clear input node 186 transitions to a logic high. This logic high turns on the first clearing FET 216, the second clearing FET 218, and the third clearing FET 220, thereby enabling a conductive path between the node A 88 and the common reference node 98, the node D 102 and the common reference node 98, and the output node 84 and the common reference node 98. After a period of time, the signal 268 on the clear input node 186 transitions to a logic low. In certain embodiments, the first latching circuit 140 and the second latching circuit 142 are on alternatively during vertical blanks between frames. In such embodiments, the signal 268 on the clear input node 186 may be asserted during the vertical blanks near a time in which the signal 226 on the first enable node 148 and the signal 234 on the second enable node 152 are alternated.

Figure 13:
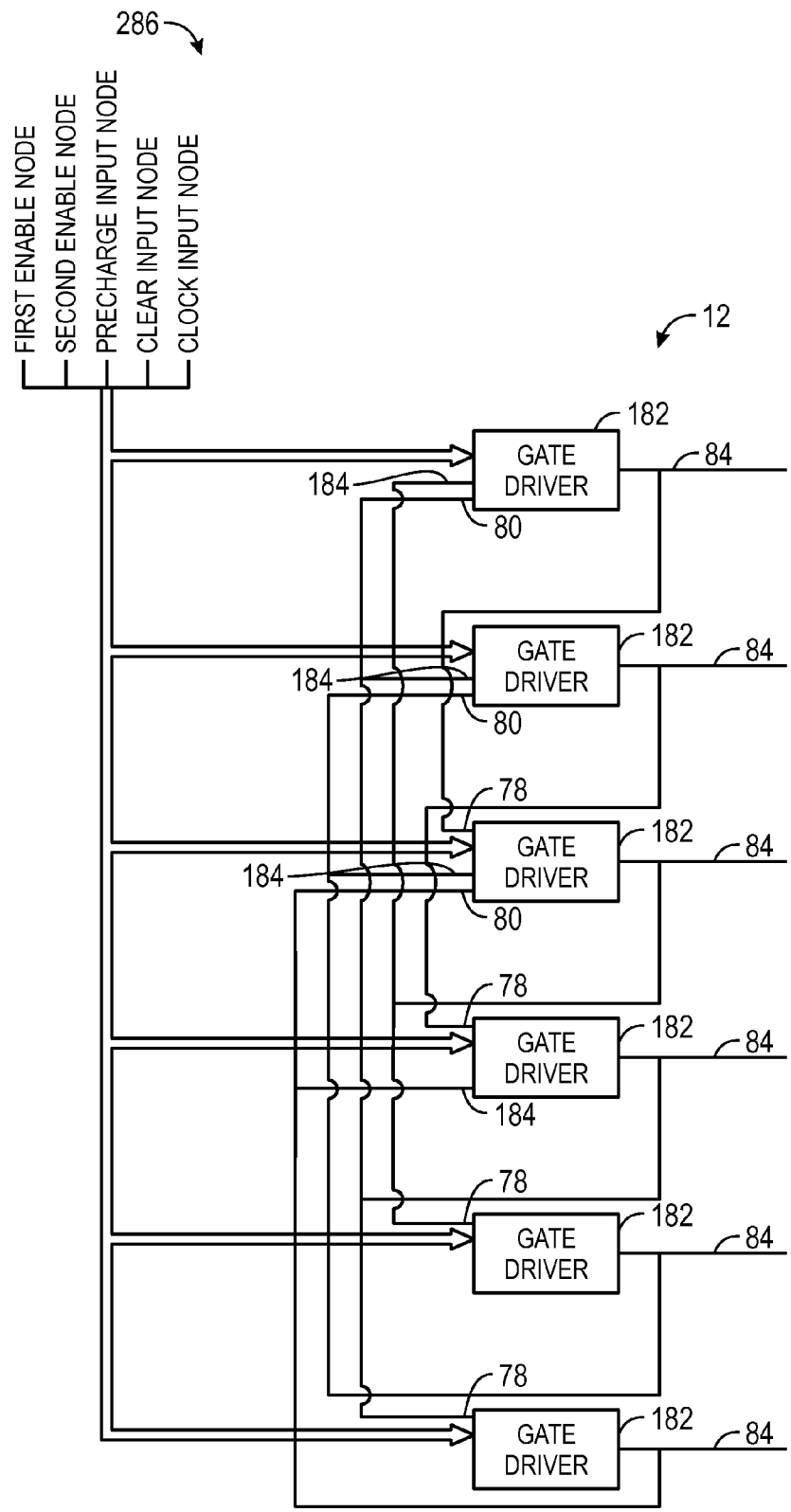
FIG. 13 illustrates a block diagram of gate driver circuitry that may be found in the display of FIG. 1, in accordance with an embodiment.

As discussed above, the gate driver 182 is configured to operate using a single clock. As illustrated in a block diagram 286 of FIG. 13, multiple gate drivers 182 may be arranged in the display 12 to use a single clock input for each gate driver. However, the gate driver bank may use multiple clocks. For example, the gate driver bank may use four clocks with each clock having a 90 degree shift from another of the four clocks. Specifically, each gate driver 182 is configured to receive signals provided to the first enable node 148, the second enable node 156, the precharge input node 183, the clear input node 186, and the clock input node 82. Furthermore, the set input node 78 is coupled to the output node 84 from the gate driver 182 coupled to the G−2 gate line (e.g., the gate line from the gate driver 182 two before a selected gate driver 182), as illustrated. In addition, the discharge input node 184 is coupled to the output node 84 from the gate driver 182 coupled to the G+2 gate line (e.g., the gate line from the gate driver two after the selected gate driver 182). Moreover, the reset input node 80 is coupled to the output node 84 from the gate driver 182 coupled to the G+3 gate line (e.g., the gate line from the gate driver three after the selected gate driver 182). Thus, the gate drivers 182 of the display 12 may be configured to use a single clock signal.

As set forth above, the gate driver 182 may be configured to have only one clock input. The set and reset inputs to the gate driver 182 (e.g., the set input node 78, the reset input node 80) are driven by the outputs from adjacent gate drivers. As may be appreciated, because each gate driver 182 is only turned on and off once in each frame, the switching power to drive the set and reset inputs is low. In contrast, other embodiments of gate drivers may use multiple clock inputs to set and reset each gate driver. In such embodiments, the multiple clock inputs turn on and off the set and reset inputs to each driver multiple times during each frame (e.g., greater than 100 times, or more). Thus, such embodiments consume substantially more power than the gate driver 182 because they switch many internal FETs in each frame.

Figure 14:
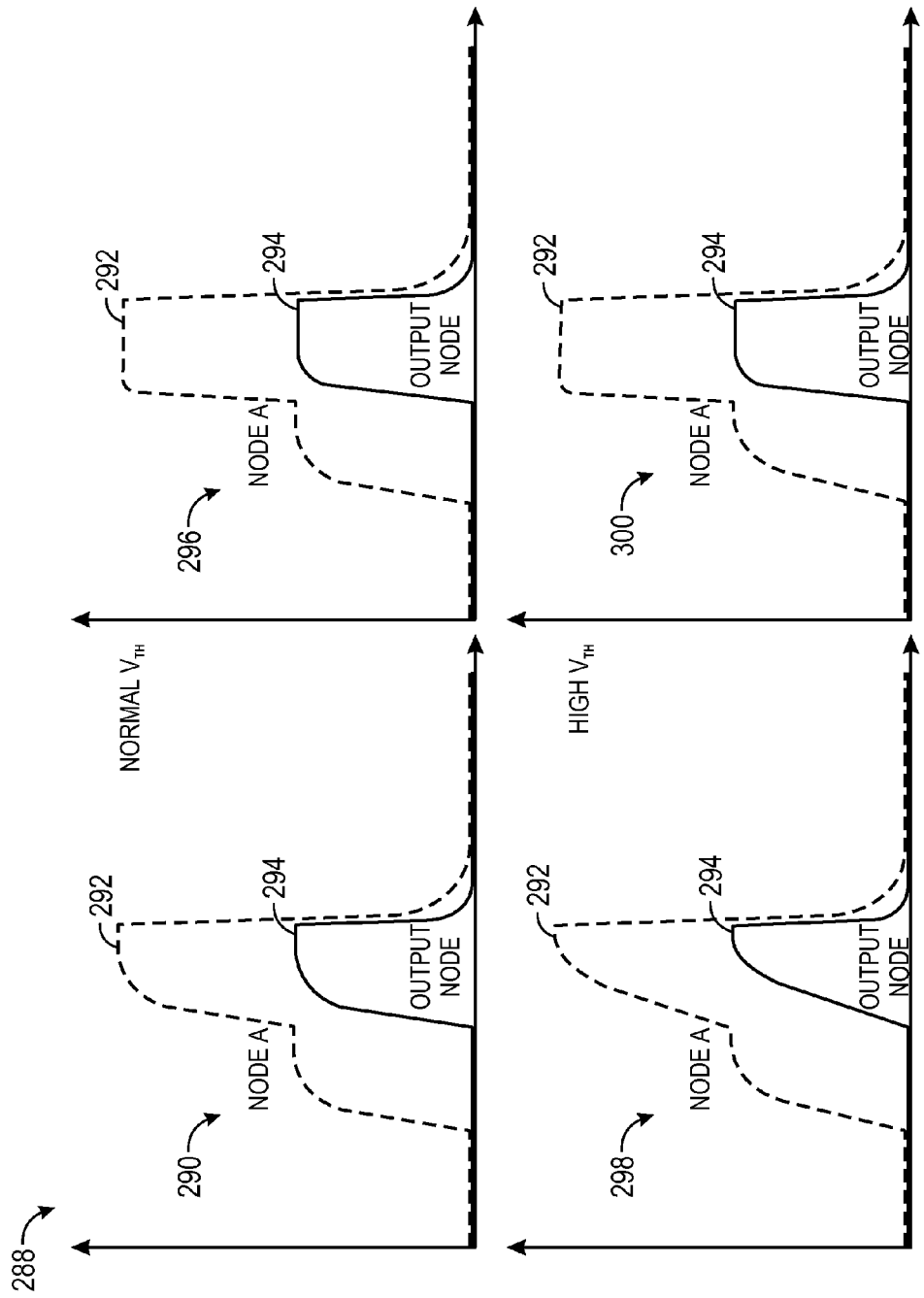
FIG. 14 illustrates graphs of signals of gate driver circuitry that may be found in the display of FIG. 1, in accordance with an embodiment.

As discussed above, the use of separate FETs (e.g., the fourth FET 106 and the fifth FET 108) instead of a single FET for bootstrapping the capacitor 100 provides a number of advantages. FIG. 14 illustrates graphs 288 of signals of gate driver circuitry that may be found in the display 12 of FIG. 1. Specifically, the graph 290 illustrates a curve 292 representing a signal on the node A 88, and a curve 294 representing a signal on the output node 84. The graph 290 illustrates signals from an embodiment of the gate driver similar to FIG. 6, but a single FET having a gate coupled to the node A 88 and to a first end of the capacitor 100, a drain coupled to the clock input node 82, and a source coupled to the output node 84 and to the second end of the capacitor 100 replaces the fourth and fifth FETs 106 and 108. In contrast, a graph 296 illustrates signals from an embodiment of the gate driver using the fourth and fifth FETs 106 and 108 as illustrated in FIG. 6. The graphs 290 and 296 relate to embodiments in which a threshold voltage ($V_{TH}$) of the FET(s) is within normal operating ranges.

As may be appreciated, after operating FETs for a period of time, the threshold voltage may drift (e.g., increase, decrease, Etc.). Accordingly, a graph 298 illustrates signals from an embodiment of the gate driver with the single FET similar to the graph 290; however, the threshold voltage is in a high operating range due to drift of the threshold voltage. Similarly, a graph 300 illustrates signals from an embodiment of the gate driver with the fourth and fifth FETs 106 and 108 similar to the graph 296; however, the threshold voltage is in a high operating range due to drift of the threshold voltage. As illustrated in the graphs 288, gate drivers with the fourth and fifth FETs 106 and 108 (e.g., graphs 296 and 300) are able to provide a more distinct logic high output than gate drivers with a single FET (e.g., graphs 290 and 298). As may be appreciated, a voltage level present on the common voltage node 98 described herein may be a negative voltage (e.g., −1.0, −5.0, −7.0 volts). As such, threshold voltage drift may be reduced and/or reversed by the negative voltage present on the common voltage node 98.

The gate drivers as described herein include a number of advantages. For example, bootstrapping may be more effective using the fourth and fifth FETs 106 and 108, as compared to using a single FET in their place. Furthermore, by using the fourth and fifth FETs 106 and 108 a smaller capacitor 100 may be used, such as up to three times smaller. In addition, the threshold voltage drift may be reduced by using multiple latching circuits, as described herein. As described herein, the gate drivers do not include a leakage path between the node A 88 and the node B 94, the node A 88 and the node B1 146, and/or the node A 88 and the node B2 154. Moreover, using the capacitive FETs 198 and 204 to hold the node B1 146 and the node B2 154 facilitates tracking the coupling capacitance of other FETs. Furthermore, the gate drivers described herein may use only one clock, thereby reducing power consumption and decreasing voltage threshold drift.

As used herein, a "source" and a "drain" of FETs are described as being coupled to other components. As may be appreciated, in some embodiments, the source and the drain may be interchanged depending on the type of FET used. Accordingly, in an embodiment in which the term "source" is used, the term "source" may be replaced by the term "drain." In addition, in an embodiment in which the term "drain" is used, the term "drain" may be replaced by the term "source."

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A display for an electronic device, comprising:
   a gate driver comprising:
      an output node configured to be coupled to a gate line and to provide power to the gate line for driving thin-film transistor (TFT) gates of the display;
      an input node configured to receive an input signal;
      a first field-effect transistor (FET) having a first gate, a first drain, and a first source, wherein the first drain is coupled to the input node and the first source is coupled to the output node;
      a second FET having a second gate, a second drain, and a second source, wherein the second drain is coupled to the input node; and
      a capacitor having a first end and a second end, wherein the first end of the capacitor is coupled to the first gate and the second gate, and the second end of the capacitor is coupled to the second source.

2. The display of claim 1, wherein the input node is configured to receive a clock signal as the input signal.

3. The display of claim 1, wherein the first FET is a first metal-oxide-semiconductor FET (MOSFET) and the second FET is a second MOSFET.

4. The display of claim 3, wherein the first MOSFET is a first n-channel MOSFET (NMOS) and the second MOSFET is a second NMOS.

5. The display of claim 1, wherein the gate driver comprises a set node configured to provide power to the first end of the capacitor to charge the capacitor.

6. The display of claim 1, wherein the gate driver comprises circuitry coupled to the first end of the capacitor and configured to drive the first end of the capacitor toward a low voltage.

7. The display of claim 1, wherein the gate driver comprises circuitry coupled to the second end of the capacitor and configured drive the second end of the capacitor toward a low voltage.

8. The display of claim 7, wherein the circuitry comprises a third FET.

9. A gate driver for an electronic display, comprising:
an output node configured to be coupled to a gate line and to provide power to the gate line for driving thin-film transistor (TFT) gates of the display;
an input node configured to receive an input signal;
a field-effect transistor (FET) having a gate, a drain, and a source, wherein the drain is coupled to the input node and the source is coupled to the output node;
a capacitor having a first end and a second end, wherein the first end of the capacitor is coupled to the gate of the FET; and
a plurality of latching circuits coupled to the first end of the capacitor and configured to alternatively drive the first end of the capacitor toward a low voltage.

10. The gate driver of claim 9, wherein each latching circuit of the plurality of latching circuits comprises a latching FET having a second gate, a second drain, and a second source, and an inverter having an inverter input, an inverter output, and an enable input node.

11. The gate driver of claim 10, wherein the inverter input is coupled to the first end of the capacitor, the inverter output is coupled to the second gate, the second drain is coupled to the first end of the capacitor, the second source is coupled to a common reference node, and the enable input is configured to selectively enable the inverter to invert a signal provided to the inverter input and to provide the inverted signal to the inverter output.

12. The gate driver of claim 9, wherein each latching circuit of the plurality of latching circuits comprises a latching FET having a second gate, a second drain, and a second source, a latching capacitor, and an enable input node.

13. The gate driver of claim 12, wherein the latching capacitor is coupled to the enable input node and to the second gate, the second drain is coupled to the first end of the capacitor, and the second source is coupled to a common reference node.

14. An electronic device comprising:
a gate driver comprising:
an output node configured to be coupled to a gate line and to provide power to the gate line;
an input node configured to receive an input signal;
a first field-effect transistor (FET) having a first gate, a first drain, and a first source, wherein the first drain is coupled to the input node and the first source is coupled to the output node;
a first capacitor having a first end and a second end, wherein the first end of the first capacitor is coupled to the first gate; and
a latching circuit comprising:
a second FET having a second gate, a second drain, and a second source;
a third FET having a third gate, a third drain, and a third source;
a second capacitor having a first end and a second end; and
a reset node configured to receive a reset signal for driving the first end of the first capacitor toward a low voltage, wherein the reset node is coupled to the second gate and the second drain, the second source is coupled to the first end of the second capacitor and to the third gate, the third drain is coupled to the first end of the first capacitor, and the second end of the second capacitor is coupled to the third source.

15. The electronic device of claim 14, comprising an electronic display having the gate driver.

16. The electronic device of claim 14, wherein at least one of the first, second, and third FETs comprises a metal-oxide-semiconductor FET (MOSFET).

17. The electronic device of claim 14, comprising a fourth FET having a fourth gate, a fourth drain, and a fourth source, wherein the fourth drain is coupled to the input node, the fourth gate is coupled to the first end of the first capacitor, and the fourth source is coupled to the second end of the first capacitor.

18. A method comprising:
activating a first enable node of a gate driver to enable a first latching circuit of the gate driver;
deactivating a second enable node of the gate driver to disable a second latching circuit of the gate driver while activating the first enable node; and
activating a precharge node of the gate driver while the first latching circuit is enabled to store a first charge in a first capacitor of the first latching circuit.

19. The method of claim 18, comprising deactivating the precharge node after activating the precharge node and activating a first field-effect transistor (FET) using the first charge of the first capacitor to charge a second capacitor.

20. The method of claim 19, comprising activating a set node of the gate driver after deactivating the precharge node to discharge the first capacitor and to charge the second capacitor.

21. The method of claim 20, comprising deactivating the set node after activating the set node and applying a clock pulse to activate an output node of the gate driver.

22. An electronic display comprising:
a gate driver comprising:
a capacitor having a first end and a second end;
a first latching circuit coupled to the first end of the capacitor and configured to couple the first end of the capacitor to a common reference node while enabled and while charged;
a first enable node configured to receive a first signal to enable the first latching circuit;
a second latching circuit coupled to the first end of the capacitor and configured to couple the first end of the capacitor to the common reference node while enabled and while charged;
a second enable node configured to receive a second signal to enable the second latching circuit;
a precharge input node configured to receive a third signal to charge the first latching circuit, to charge the second latching circuit, or some combination thereof;
a set input node configured to receive a fourth signal to charge the capacitor;

an output node configured to be coupled to a gate line and to provide power to the gate line for driving thin-film transistor (TFT) gates of the electronic display; and a clock input node configured to receive a fifth signal configured to charge the capacitor and to provide an output signal to the output node.

23. The electronic display of claim 22, wherein the gate driver comprises a reset input node configured to receive a sixth signal to charge the first latching circuit, to charge the second latching circuit, or some combination thereof.

24. The electronic display of claim 22, wherein the gate driver comprises a clear input node configured to receive a sixth signal to couple the first end of the capacitor to the common reference node, to couple the second end of the capacitor to the common reference node, and to couple the output node to the common reference node.

25. The electronic display of claim 22, wherein the set input node is configured to receive the fourth signal from a second output node of a second gate driver, and wherein the clock input node is the only input to the gate driver configured to receive a clock signal.

* * * * *